United States Patent [19]
Vanden Brande et al.

[11] Patent Number: 6,083,359
[45] Date of Patent: Jul. 4, 2000

[54] PROCESS AND DEVICE FOR FORMING A COATING ON A SUBSTRATE BY CATHODE SPUTTERING

[75] Inventors: Pierre Vanden Brande, Brussels; Alain Weymeersch, Wavre, both of Belgium

[73] Assignee: Recherches Et Developpement Du Groupe Cockerill Sambre, en abrege: RDCS, Liege, Belgium

[21] Appl. No.: 09/319,560
[22] PCT Filed: Dec. 9, 1997
[86] PCT No.: PCT/BE97/00133
  § 371 Date: Jun. 8, 1999
  § 102(e) Date: Jun. 8, 1999
[87] PCT Pub. No.: WO98/26108
  PCT Pub. Date: Jun. 18, 1998

[30] Foreign Application Priority Data
Dec. 10, 1996 [BE] Belgium ............................. 09601030

[51] Int. Cl.⁷ ............................. C23C 14/56; C23C 14/34
[52] U.S. Cl. .................. 204/192.12; 204/192.15; 204/298.12; 204/298.15; 204/298.23; 204/298.24; 204/298.27; 204/298.28
[58] Field of Search ............ 204/298.12, 298.15, 204/298.23, 298.24, 298.27, 298.28, 192.12, 192.15

[56] References Cited

U.S. PATENT DOCUMENTS 4,562,093 12/1985 Mario et al. ............................. 427/109
4,866,032 9/1989 Fujimori et al. ..................... 204/298.24
5,108,571 4/1992 Ludwig et al. ...................... 204/192.13
5,228,963 7/1993 Rose .................................. 204/192.12

FOREIGN PATENT DOCUMENTS 0 685 571 12/1995 European Pat. Off. .
34 00 843 7/1985 Germany .
59-74277 4/1984 Japan .

OTHER PUBLICATIONS

Patents abstracts of Japan, for JP 04–290617, published May 17, 1994.
Patents abstracts of Japan, for JP 59–074277, published Apr. 26, 1984.
Patents abstracts of Japan, for JP 03–174620, published Dec. 24, 1992.

*Primary Examiner*—Alan Diamond
*Attorney, Agent, or Firm*—Browdy and Neimark

[57] ABSTRACT

Disclosed is a process for forming a coating on a substrate (2,2') by cathode sputtering, comprising the coating of substrate surfaces (2,2') which have been transferred to a cathode sputtering chamber (1). The substrates vary in width and have a predetermined maximum width. The process involves the use of a target (3) whose surface (4) has an invariable length corresponding approximately to said maximum substrate width. A shift takes place, in accordance with the width of the substrate being coated, between the surface (4) of the target and the substrate surface to be coated, so that the entire surface of the target remains more or less constantly in front of the surface to be coated during the cathode sputtering process.

20 Claims, 3 Drawing Sheets

PROCESS AND DEVICE FOR FORMING A COATING ON A SUBSTRATE BY CATHODE SPUTTERING

CROSS REFERENCE TO RELATED APPLICATION

The present application is the national stage under 35 U.S.C. 371 of PCT/BE97/00133, filed Dec. 9, 1997.

The present invention relates to a process for forming a coating on a substrate by cathodic sputtering, comprising transfer of the substrate between an inlet and an outlet of a cathodic sputtering chamber, passage of at least one surface to be coated of the substrate parallel to a surface of a target, oriented towards this substrate surface and containing one or more elements to be deposited on the substrate, and during this passage, cathodic sputtering of said one or more elements to be deposited on the entirety of the surface to be coated from said target surface.

Such cathodic sputtering processes and devices have long been known (c.f. for example EP-A-0685571).

One problem encountered in currently known devices is that the substrates to be coated, for example in strip form, are of variable widths. This means that, if a substrate of a width less than the target is passed before a target of a given length in a cathodic sputtering chamber, material is lost due to sputtering beyond the edges of the substrate resulting in contamination of the chamber.

The present solution to overcome these problems is to use variable length targets which are changed depending upon the width of the substrate to be processed. This takes up considerable space, entails installation and removal time as well as storage of different targets.

According to another solution, a single target is used with masking elements which can cover at least one of the ends of the target if the substrate to be processed is of width less than the length of the target. However, these masks must be replaced or cleaned regularly and they are not a real solution to the loss of sputtered material.

The object of the present invention is to provide a relatively simple and low cost process and device by means of which the above-mentioned problems may be overcome.

To this end, the invention provides a process as described above, comprising surface coating of substrates transferred into the chamber, which substrates are of variable width with a predetermined maximum width, by means of a target, said surface of which is of an invariable length approximately matching said maximum width of the substrate, and, depending upon the width of the substrate being coated, relative displacement between the surface of the target and the surface to be coated of the substrate, such that substantially the entirety of the surface of the target is constantly located opposite the surface to be coated during cathodic sputtering.

In this manner, maximum yield, constant for all the substrates, is obtained from a target, which is always located in its entirety opposite the surface to be coated of the substrate, while allowing cathodic sputtering over the entirety of the surface to be coated, during the passage of the substrate through the sputtering chamber.

According to one embodiment of the invention, the substrates are strips of material which proceed in a linear direction before the target and, depending upon the width of the strip, the process comprises displacement of the target between a longitudinal direction perpendicular to the direction of motion of the strip, when the width of the strip is at its maximum, and an oblique longitudinal position relative to this direction of motion, when the width of the strip is less than the maximum width. By means of simple displacement requiring little space, it is accordingly possible to adjust the target to strips of variable width which are to be processed in succession in the sputtering chamber.

According to an advantageous embodiment of the invention, this relative displacement comprises pivoting of the target in the chamber. This pivoting may preferably proceed around a central shaft of the target or an eccentric shaft, for example arranged at one of the ends thereof. It is thus possible to provide a translational movement of the target, simultaneously with or subsequent to the pivoting movement.

Obviously, the process may be applied to any substrate, the surface of which may be coated by cathodic sputtering. The process may accordingly be used to coat, inter alia, strips or sheets of metal, glass, paper, plastics. Nevertheless, application of the process is not restricted to two-dimensional products such as strips, but may also be applied to coating the surfaces of three-dimensional objects, for example bars, rails, etc..

The sputtering process is not restricted to conventional cathodic sputtering with a solid target. Targets having a liquid surface layer may also be used (c.f. for example EP-A-0685571). The liquid layer of such a target may accordingly simultaneously be evaporated by sputtering, with subsequent condensation on the surface to be coated.

The present invention also provides a device for forming a coating on a substrate by cathodic sputtering comprising a cathodic sputtering chamber provided with an inlet and outlet for the substrate, transfer means to convey the substrate between the inlet and outlet, a target having a surface oriented towards a surface to be coated of the substrate and arranged parallel thereto and containing one or more elements to be deposited on the substrate, and means to achieve cathodic sputtering of said one or more elements to be deposited from said surface of the target onto the substrate, this device being provided for coating substrate surfaces of variable width with a predetermined maximum width, and comprising a target, the surface of which is of an invariable length approximately matching the maximum width of the substrate, as well as means to provide relative displacement between the surface of the target and the surface to be coated of the substrate, such that substantially the entirety of the surface of the target is constantly located opposite the surface to be coated during cathodic sputtering.

BRIEF DESCRIPTION OF DRAWING

Other details and particular features of the invention may be found in the following, non-limiting description given below with reference to the attached drawings.

Identical or analogous elements on the various drawings have identical reference numerals.

DETAILED DESCRIPTION OF EMBODIMENTS

Figure 1:
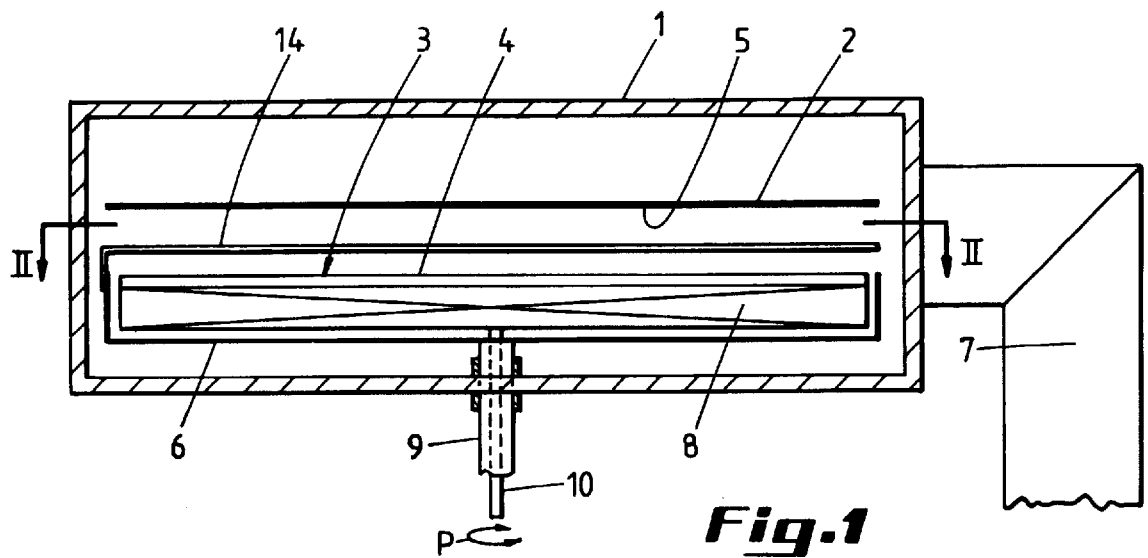
FIG. 1 is a schematic cross-sectional view of a cathodic sputtering chamber according to the invention taken along line I—I of FIG. 2.
Figure 2:
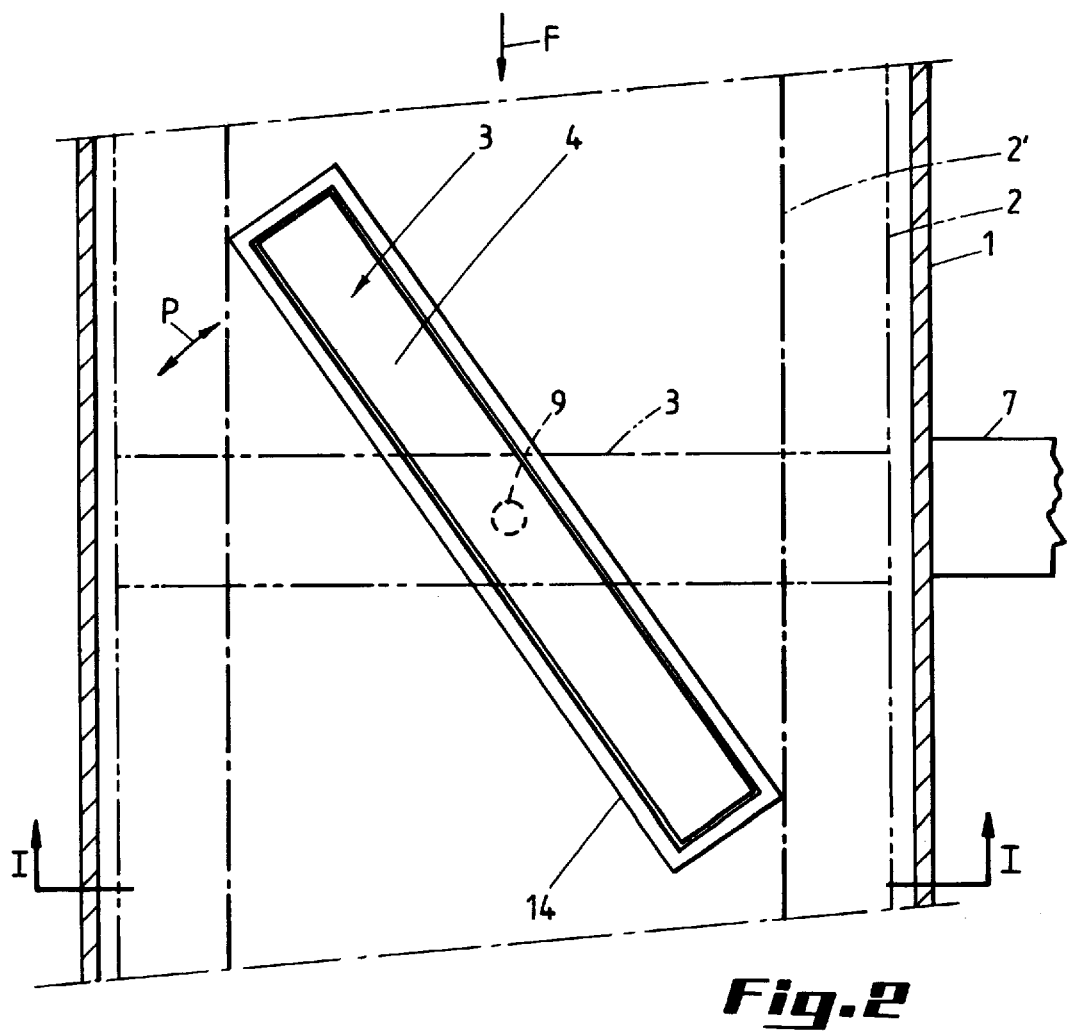
FIG. 2 is a schematic cross-sectional view of this cathodic sputtering chamber taken along line II—II of FIG. 1.

FIGS. 1 and 2 show a device according to the invention for forming a coating on a substrate by cathodic sputtering. This device comprises a cathodic sputtering chamber 1 which is provided with an inlet and an outlet (not shown) for the substrate 2. In the exemplary embodiment, this substrate 2 is a strip of material having a maximum width beyond which the present device would no longer be suitable for applying a coating.

A target, denoted overall by the reference number 3, is arranged within the chamber. This target has a surface 4, oriented towards the surface to be coated 5 of the substrate 2 and arranged parallel to said latter surface. The target 3 contains one or more elements to be deposited on the substrate by cathodic sputtering, this or these element(s) possibly being metals, for example.

This device also comprises, in a manner known per se, transfer means (not shown) intended for conveying the substrate between the inlet and outlet of the chamber. In the case of a substrate 2 in strip from, the strip may be wound onto a feed reel outside the chamber, introduced into the chamber and then rewound onto a storage reel also provided inside the chamber. This latter reel could, for example, be turned by an electric motor.

Finally, the chamber 1 also comprises known means for cathodically sputtering at least one element to be deposited from said surface of the target onto the substrate. To this end, the chamber encloses a gas shower 14 in the form of a perforated pipe forming a frame above the target. This tube is used to introduce an inert gas for ionisation, such as argon, or optionally an argon-based gas mixture also containing a reactive gas such as $C_2H_2$, $O_2$ etc. In the exemplary embodiment shown, this gas shower 14 is supported in a fixed manner by a shielding screen 6, which partially surrounds the target 3.

The chamber also comprises, as means to achieve cathodic sputtering, a vacuum line 7, connected to a vacuum pump (not shown), to reduce the pressure within the chamber and a per se known magnetic circuit 8 of a conventional magnetron. This latter is integral with the target 3 and allows the formation of a plasma in the vicinity of the surface 4 of the target 3. Within this unit comprising the target 3 and the magnetic circuit, it is also possible, in a manner known per se, to provide heating and/or cooling systems to control temperature, together with electrical conductors connected to the target.

In the exemplary embodiment according to the invention shown in FIGS. 1 and 2, the device is provided for coating surfaces of substrates of a variable width. In addition to the substrate 2 of the maximum width, FIG. 2 also shows a substrate 2' of a distinctly narrower width.

These two substrates are processed in the device according to the invention by using the same target 3, the length of which approximately matches the maximum width of the substrate 2 (c.f. FIG. 2), in the position of the target perpendicular to the direction of motion F of the substrate.

In order to process substrate 2', the device comprises means which allow relative displacement between the surface 4 of the target 3 and the surface to be coated 5 of the substrate 2.

In the exemplary embodiment shown in FIGS. 1 and 2, in the position of the target 3 shown in solid lines on FIG. 2, the target is in an oblique longitudinal position relative to the direction of motion F of the substrate. In this position, the entirety of the surface 4 is opposite the substrate 2 and the entirety of the surface to be coated 5 of the substrate passes before the target 3 during cathodic sputtering, so minimising material losses.

In the exemplary embodiment shown in FIGS. 1 and 2, the above-mentioned relative displacement means comprise a hollow pivot shaft 9, which passes through the wall of the chamber 1 in an airtight manner and which supports the shielding screen 6 in a fixed manner, in such a manner as to allow this screen to rotate together with this shaft. The shaft 9 is rotated by a conventional mechanism (not shown) which is located outside the chamber. A hollow tube 10 passes within this hollow pivot shaft and supports the target 3 and the magnetic circuit 8 in the center thereof and rotates integrally with the pivot shaft 9. This tube 10 may, for example, accommodate inter alia electricity, gas, heating and/or cooling media supplies. This arrangement accordingly allows common rotation of the screen 6, the gas shower 5, the target 3 and the magnetron 8 together with the shaft 9 in accordance with the arrow P, while the chamber 1 remains stationary.

Figure 3:
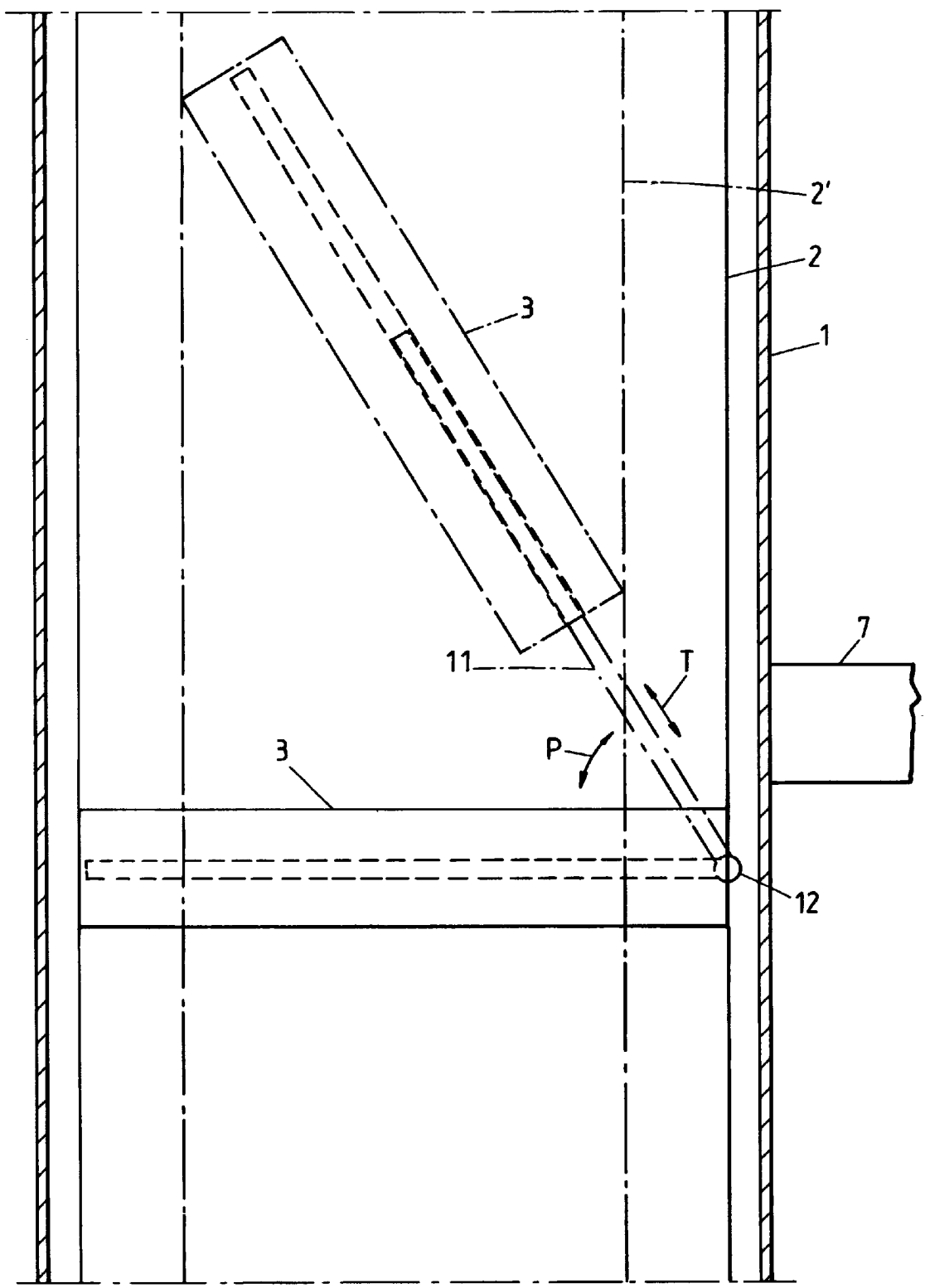
FIG. 3 is a view, analogous to FIG. 2, of a variant embodiment according to the invention.

In the exemplary embodiment according to FIG. 3, the relative displacement means between the surface 4 of the target 3 and the surface to be coated 5 of the substrate 2 comprise a slider 11, which supports the target 3 and the magnetic circuit 8 in such a manner that they can slide in accordance with the double-ended arrow T. This slider is supported in the chamber by a rotation shaft 12 arranged to the side of the course of the substrates to be coated and allowing the target to pivot in accordance with the double-ended arrow P.

The target 3 may be slid along the slide 11 by any desired appropriate means, for example by means of a hydraulic jack (not shown). Rotation of the shaft 12 is achieved, as with shaft 9, by means outside the chamber.

Since the target undergoes translational motion subsequently to or simultaneously with the rotation thereof, flexible connections (not shown) are provided to the target so that it can still be supplied with cooling and/or heating media, electricity etc..

Figure 4:
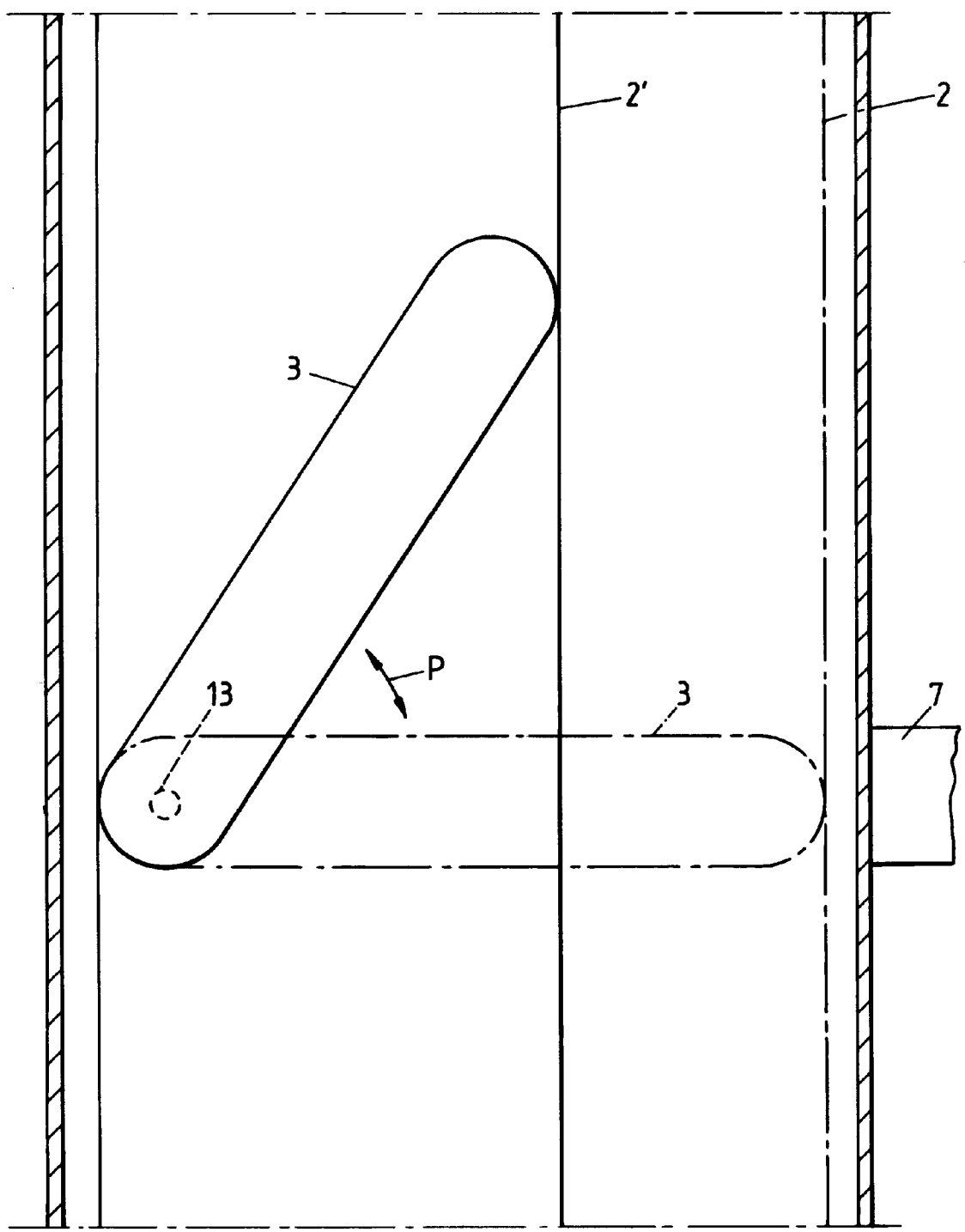
FIG. 4 is a view, analogous to FIG. 2, of another embodiment according to the invention.

As may be seen from FIG. 4, the target in this case has semi-circular ends and one of the ends thereof is supported by a rotation shaft 12. The target pivots in accordance with the double-ended arrow P around the eccentric shaft 12 when the narrower substrate 2' is to be coated. In this latter case, the substrate no longer passes centrally through the chamber, as in the exemplary embodiments described above, but in an offset manner towards one of the sides of the chamber, adjacent to the shaft 12. Thanks to this configuration, the target may always be maintained tangentially to the edges of the substrate, so further minimising material losses.

It should be noted that the present invention is not in any way restricted to the embodiments described above and that considerable changes may be made without extending beyond the scope of the invention stated in the following claims.

For example, if the targets are preferably in a horizontal position and if the surface from which cathodic sputtering is performed is preferably directed upwards, it is possible to provide targets arranged vertically or obliquely. The substrate to be coated must then be arranged parallel thereto.

However, a different orientation is not possible for those targets having a liquid surface and in the event that it may be foreseen that, in addition to cathodic sputtering, the liquid will evaporate and subsequently condense on the substrate.

The rotational and/or translational drive system for the targets may be within the chamber or outside it.

What is claimed is:

1. Process for forming a coating on at least one substrate by cathodic sputtering comprising transfer of the at least one substrate between an inlet and an outlet of a cathodic sputtering chamber, passage of at least one surface to be coated of the substrate parallel to a surface of a target, oriented towards the substrate surface and containing one or more elements to be deposited on the substrate, and during this passage, cathodic sputtering of said one or more elements to be deposited on the entirety of the surface to be coated from said target surface, characterized in that it comprises surface coating of the at least one substrate transferred into the chamber by a target, said substrate having a maximum width and said surface of said target having an invariable length approximately matching said maximum width of the substrate, and, depending upon the width of the substrate being coated, relative displacement between the surface of the target and the surface to be coated of the substrate, such that substantially the entirety of the surface of the target is constantly located opposite the surface of said substrate to be coated during cathodic sputtering.

2. Process according to claim 1 for the coating of plural substrates, characterized in that the substrates to be coated are strips of material which proceed in a linear direction before the target and in that, depending upon the width of the strip, the process comprises displacement of the target between a longitudinal direction perpendicular to the direction of motion of the strip, when the width of the strip is at its maximum, and an oblique longitudinal position relative to said direction of motion of the strip, when the width of the strip is less than the maximum width.

3. Process according to claim 1, characterised in that the relative displacement between the surface of the target and the surface to be coated of the substrate comprises pivoting of the target in the chamber, during which pivoting said target surface remains parallel to said surface to be coated, and at an unchanged distance therefrom.

4. Process according to claim 3, wherein said pivoting is around a central shaft of the target.

5. Process according to claim 3, wherein said pivoting is around an eccentric shaft of the target.

6. Process according to claim 5, further comprising a translational movement of the target, simultaneously with or subsequent to the pivoting movement.

7. Process according to claim 1, characterised in that the substrate to be coated is composed of metal, glass, paper, or plastics.

8. Process according to claim 1, characterised in that said surface of the target is formed by a solid or liquid surface layer.

9. Process according to claim 1, characterised in that said surface of the target is liquid and in that it comprises, simultaneously with said cathodic sputtering, evaporation of the one or more elements providing the coating, followed by condensation thereof on the substrate to be coated.

10. The process of claim 2, wherein said substrates are composed of metal, glass, paper or plastics.

11. The process of claim 3, wherein said substrates are composed of metal, glass, paper or plastics.

12. Process according to claim 11, characterized in that said surface of the target is formed by a solid or liquid surface layer.

13. Process according to claim 12, characterized in that said surface of the target is liquid and in that said process comprises, simultaneously with said cathodic sputtering, evaporation of the one or more elements providing the coating, followed by condensation thereof on the substrate to be coated.

14. Process according to claim 2, characterized in that said surface of the target is liquid and in that said process comprises, simultaneously with said cathodic sputtering, evaporation of the one or more elements providing the coating, followed by condensation thereof on the substrate to be coated.

15. The process of claim 5 wherein said target has a pair of longitudinal ends, and said pivoting of said target in the chamber around an eccentric shaft thereof comprises pivoting around one of the longitudinal ends of said target.

16. Device for forming a coating on a substrate by cathodic sputtering comprising a cathodic sputtering chamber provided with an inlet and outlet for the substrate, transfer means to convey the substrate between the inlet and outlet, a target having a surface oriented towards a surface to be coated of the substrate and arranged parallel thereto and containing one or more elements to be deposited on the substrate, and means to achieve cathodic sputtering of said one or more elements to be deposited from said surface of the target onto the substrate, characterised in that the device is provided for coating substrate surfaces of variable width and having a maximum width, and in that said device comprises a target, the surface of which is of an invariable length approximately matching the maximum width of the substrate, as well as means to provide relative displacement between the surface of the target and the surface to be coated of the substrate such that substantially the entirety of the surface of the target is constantly located opposite the surface to be coated during cathodic sputtering.

17. Device according to claim 16, characterised in that the relative displacement means comprise a pivot shaft which supports the target in the center thereof in such a manner as to allow the rotation thereof around the shaft, parallel to the surface to be coated.

18. Device according to claim 17, characterised in that the shaft is hollow and passes through the chamber in an airtight manner, allowing utility lines to be introduced into the chamber.

19. Device according to claim 16, characterised in that the relative displacement means comprise a slider, on which the target is slidable in accordance with a translational movement, and a rotation shaft on which the slider is supported in such a manner that it is pivotable parallel to the surface to be coated.

20. Device according to claim 16, characterised in that the relative displacement means comprise a pivot shaft which supports the target eccentrically in such a manner as to allow rotation thereof parallel to the surface to be coated.

* * * * *